United States Patent
Wen et al.

(10) Patent No.: US 8,527,930 B2
(45) Date of Patent: Sep. 3, 2013

(54) GENERATING AND USING ROUTE FIX GUIDANCE

(75) Inventors: Linni Wen, Mountain View, CA (US); Tong Gao, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 220 days.

(21) Appl. No.: 12/695,513

(22) Filed: Jan. 28, 2010

(65) Prior Publication Data

US 2011/0185329 A1  Jul. 28, 2011

(51) Int. Cl.
*G06F 17/50* (2006.01)
(52) U.S. Cl.
USPC ............................ 716/130; 716/126; 716/129
(58) Field of Classification Search
USPC .......................................... 716/126, 129, 130
See application file for complete search history.

(56) References Cited

U.S. PATENT DOCUMENTS

| | | | |
|---|---|---|---|
| 6,615,401 B1 * | 9/2003 | Gasanov et al. | 716/114 |
| 7,752,590 B1 * | 7/2010 | Chyan et al. | 716/122 |
| 7,971,174 B1 * | 6/2011 | Khalsa et al. | 716/129 |
| 2007/0101303 A1 * | 5/2007 | Lien et al. | 716/5 |
| 2007/0266352 A1 * | 11/2007 | Cheng et al. | 716/4 |
| 2009/0113371 A1 * | 4/2009 | He et al. | 716/12 |
| 2011/0231804 A1 * | 9/2011 | Liu et al. | 716/54 |

* cited by examiner

*Primary Examiner* — Suresh Memula
(74) *Attorney, Agent, or Firm* — Park, Vaughan, Fleming & Dowler, LLP; Laxman Sahasrabuddhe

(57) ABSTRACT

Some embodiments of the present invention provide systems for generating and using a route fix guidance for fixing design rule violations. A route fix guidance includes information that enables a router to locally modify a routing solution to fix one or more design rule violations. A route fix guidance can include a set of two or more metal avoidance areas, wherein avoiding any one of the set of two or more metal avoidance areas during routing fixes the design rule violation. Additionally, a route fix guidance can specify a set of rectangles to remove from a routing solution, and a set of rectangles to insert into or add to a routing solution. Further, the route fix guidance can include information for moving one or more vias to new locations in the routing solution. The route fix guidance can specify a sequence in which the local modifications are to be made.

18 Claims, 10 Drawing Sheets ated in FIG. 4A is ambiguous.
GENERATING AND USING ROUTE FIX GUIDANCE

TECHNICAL FIELD

The present invention relates to electronic design automation (EDA). More specifically, the present invention relates to generating and using route fix guidance information.

BACKGROUND

Related Art

Routing an integrated circuit (IC) chip involves determining routes for metal wires which electrically connect integrated circuit devices. Large-scale IC chips are typically routed using routing software, which is typically referred to as a "routing system" or "router."

If the router is aware of all design rules, the router could, at least in theory, generate a netlist that is violation free. However, for performance reasons, it is usually not practical to require the router to be aware of all design rules. For example, certain design rules may require execution of computationally intensive lithography models. Trying to satisfy such design rules during routing can substantially slow down the routing process.

Hence, it may be desirable to ignore such design rules during routing. As a result, the routing solution may include design rule violations, which are typically fixed during a post-routing flow. Specifically, once the design rule violations are identified in a routing solution, local modifications can be made to the routing solution to fix the design rule violations.

SUMMARY

Some embodiments of the present invention provide a system for generating a route fix guidance for fixing a design rule violation. A route fix guidance includes information that enables a router to locally modify a routing solution to fix one or more design rule violations. During operation, the system can receive a design rule violation. Next, the system can generate a route fix guidance which includes a set of two or more metal avoidance areas, wherein avoiding any one of the set of two or more metal avoidance areas during routing fixes the design rule violation. Each metal avoidance area can be specified using a set of one or more rectangles. Further, the route fix guidance can specify a sequence in which the set of two or more metal avoidance areas are to be used for fixing the design rule violation. A route fix guidance can also specify a set of rectangles to remove from a routing solution, and a set of rectangles to insert into or add to a routing solution. Further, the route fix guidance can include information for moving one or more vias to new locations in the routing solution.

Some embodiments of the present invention provide a system for fixing a design rule violation using a route fix guidance. During operation, the system can receive a route fix guidance which includes a set of two or more metal avoidance areas. Next, the system can re-route a portion of the routing solution using a metal avoidance area. If the re-routed portion of the routing solution does not avoid the metal avoidance area, the system can use the next metal avoidance area in the set of metal avoidance areas. In this manner, the system can try different metal avoidance areas until the system runs out of metal avoidance areas to try, or the re-routed solution avoids one of the metal avoidance areas.

If the route fix guidance specifies a set of rectangles that need to be removed, a set of rectangles that need to be inserted, and/or a set of vias that need to be moved to new locations, the system can perform these modifications before trying to re-route a portion of the routing solution to avoid a metal avoidance area.

In some embodiments, the system can construct a cost function which includes a term associated with a metal avoidance area, and use the cost function to locally re-route the routing solution. When the system fixes subsequent design rule violations, the system can keep the term in the cost function, albeit with a lower weight, to ensure that fixing subsequent design rule violations does not cause previously fixed design rule violations to reappear.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit Design Flow

Figure 1:
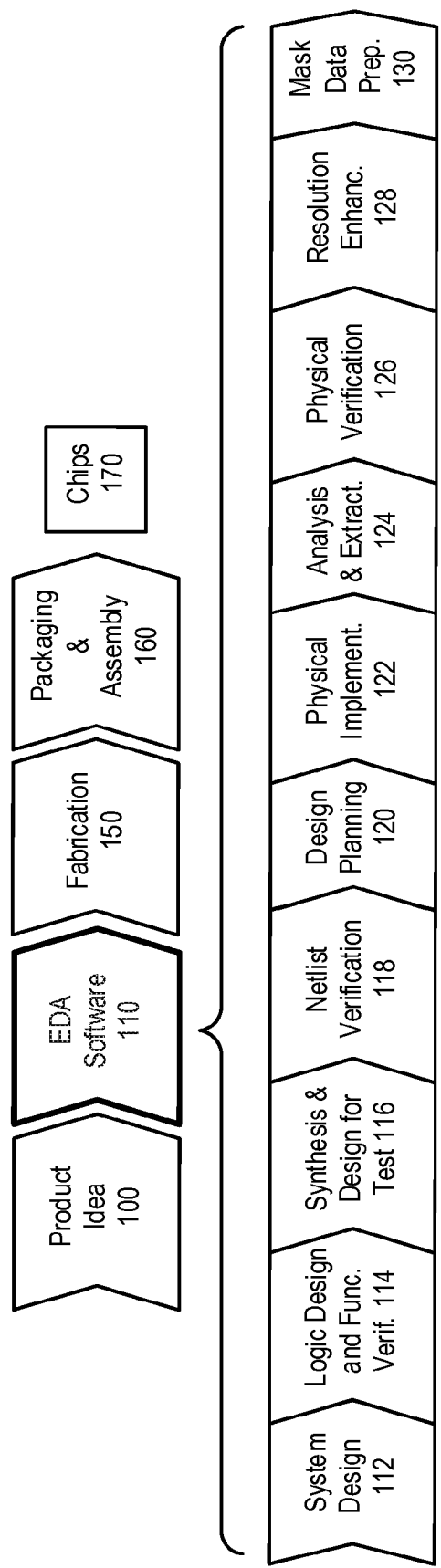
FIG. 1 illustrates various steps in the design and fabrication of an integrated circuit.

FIG. 1 illustrates various steps in the design and fabrication of an integrated circuit. The process starts with a product idea 100, which is realized using Electronic Design Automation (EDA) software 110. Chips 170 can be produced from the finalized design by performing fabrication 150 and packaging and assembly 160 steps.

A design flow that uses EDA software 110 is described below. Note that the design flow description is for illustration purposes only, and is not intended to limit the present invention. For example, an actual integrated circuit design may require a designer to perform the design flow steps in a different sequence than the sequence described below.

In the system design step 112, the designers can describe the functionality to implement. They can also perform what-if planning to refine the functionality and to check costs. Further, hardware-software architecture partitioning can occur at this step. In the logic design and functional verification step 114, a VHDL or Verilog design can be created and checked for functional accuracy.

In the synthesis and design step 116, the VHDL/Verilog code can be translated to a netlist, which can be optimized for the target technology. Further, in this step, tests can be designed and implemented to check the finished chips. In the netlist verification step 118, the netlist can be checked for compliance with timing constraints and for correspondence with the VHDL/Verilog code.

In the design planning step 120, an overall floor plan for the chip can be constructed and analyzed for timing and top-level routing. Next, in the physical implementation step 122, placement and routing can be performed.

In the analysis and extraction step 124, the circuit functionality can be verified at a transistor level. In the physical verification step 126, the design can be checked to ensure correctness for manufacturing, electrical issues, lithographic issues, and circuitry.

In the resolution enhancement step 128, geometric manipulations can be performed on the layout to improve manufacturability of the design. Finally, in the mask data preparation step 130, the design can be taped-out for production of masks to produce finished chips.

Embodiments of the present invention can be used in one or more of the above-described steps.

The Routing Problem

Routing an integrated circuit (IC) chip involves determining routes for metal wires which electrically connect integrated circuit devices to produce circuits that perform desired functions. Large-scale IC chips are typically routed using routing software, which is typically referred to as a "routing system" or "router." A router inputs a "routing problem," and outputs a "routed design" or a "routing solution."

A router typically starts by receiving multiple inputs, which can include, but are not limited to: (a) a placed netlist which provides the locations of the circuit cells/blocks (hereinafter "blocks"), (b) a description of the technology, which can further include the number of metal layers, and the characteristics of the layers, (c) the assignment of pins/terminals on the blocks according to the netlist, (d) a set of design rules that need to be satisfied by the routing solution, and (e) timing information, e.g., timing criticality. The router then determines how to route wires in the metal layers to electrically connect pins/terminals associated with a net. The routing solution can include, but is not limited to, placed wires which electrically connect all pins/terminals that belong to the same net.

Figure 2:
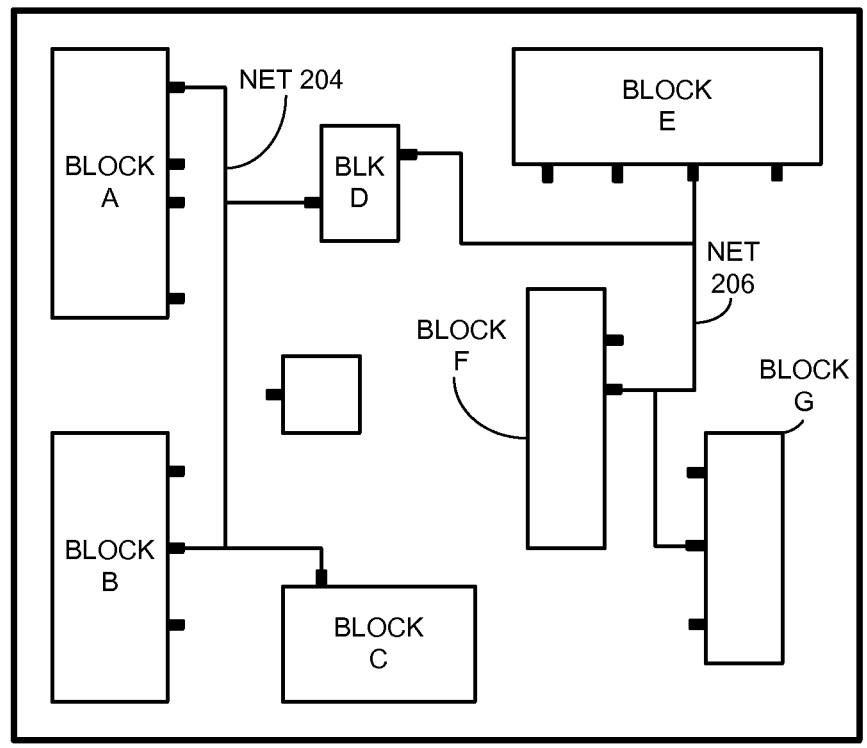
FIG. 2 illustrates an exemplary routing problem.

FIG. 2 illustrates an exemplary routing problem. The blocks illustrated in FIG. 2 can represent circuit objects at any level in the design hierarchy. For example, the blocks can be cells or macros or any other circuit object at any level of hierarchy. The locations of the blocks in FIG. 2 may be determined during the placement stage of the EDA design flow, which typically occurs prior to the routing stage.

Each block in IC chip design 202 can have one or more pins or terminals as illustrated in FIG. 2. As mentioned previously, the assignment of pins or terminals to their respective nets may also be provided as an input to the routing problem. During the routing process, the router determines a routing solution to the routing problem so that the pins or terminals that belong to the same net are electrically connected. For example, in FIG. 2, the solid lines interconnecting pins from blocks A, B, C, and D belong to net 204, and the solid lines interconnecting pins from blocks D, E, F, and G belong to net 206.

A routing process typically has three stages: global routing, track assignment, and detailed routing. Note that the routing process may have more or fewer stages. For example, some techniques combine the last two stages so that the routing process only has two stages: global routing and detailed routing. In another approach, the routing process may include a fourth stage after detailed routing which places redundant vias.

In the global routing stage, the router does not create detailed routing shapes for the wires. Instead, the router determines a high-level plan for routing the wires by partitioning the chip into so-called "g-cells."

In the track assignment stage, the router refines the global routing plan by assigning wires to tracks. Note that, although the track assignment may generate detailed routes for the wires, the routing solution at this stage may not satisfy all of the design rules, because this stage typically uses a simpler routing model than the next stage, namely, detailed routing.

Finally, in the detailed routing stage, the router starts with the coarse results produced by the global routing and track assignment stages, and creates a set of shapes which define each wire. This stage is typically the most time-consuming and computationally intensive stage among the three routing stages. The design rules are typically analyzed during this stage to ensure that the routed wires do not violate any of the design rules.

Note that routing can be performed at different levels in the design hierarchy. However, routing techniques typically operate at one physical hierarchy at a time. For example, during block level routing as illustrated in FIG. 2, the system does not consider the physical details inside the cells or the macros. At this level, the router typically represents macros and standard cells by blocks to hide unnecessary details, thereby speeding up the routing process.

Routing can be performed using different approaches. For example, routing can be performed using a top-down approach or a bottom-up approach. In the top-down approach, the top-level routing is performed before bottom-level routing. In this approach, the system may create soft macros which reserve space for routing the lower hierarchies. In contrast, in the bottom-up approach, the bottom-level routing is performed before the top-level routing. Since the lower-level routing is performed before higher-level routing, soft macros are usually not required in this approach.

A routing problem can also specify a number of optimization criteria which need to be considered during the routing process. Specifically, the optimization criteria can include, but are not limited to: (a) minimizing design rule violations, (b) minimizing via count, (c) minimizing total wire length, (d) minimizing the likelihood of timing violations, and (e) criteria related to design for manufacturing (DFM). The criteria related to DFM can further include, but are not limited to, placing redundant vias, attempting to minimize the critical area to reduce the probability that contamination particles will cause shorts and opens during manufacturing, and attempting to maximize straight wire segments to decrease layout complexity and increase manufacturability.

Note that it may not be possible to "optimize" (e.g., minimize) all of the criteria at the same time. In fact, it may not be possible to determine a global optimum for even a single criterion. Hence, terms such as "optimizing," "minimizing," "maximizing," etc. are used in this disclosure to indicate that the routing process tries to optimize one or more criteria (e.g., tries to minimize the number of design rule violations), but the routing process may terminate before a global optimum is determined for one or more criteria.

One of the core components of a router is a search engine. The problem that the search engine solves is as follows: given two sets of points, e.g., set A and set B, the search engine determines paths for wires for electrically connecting these two sets of points.

Figure 3:
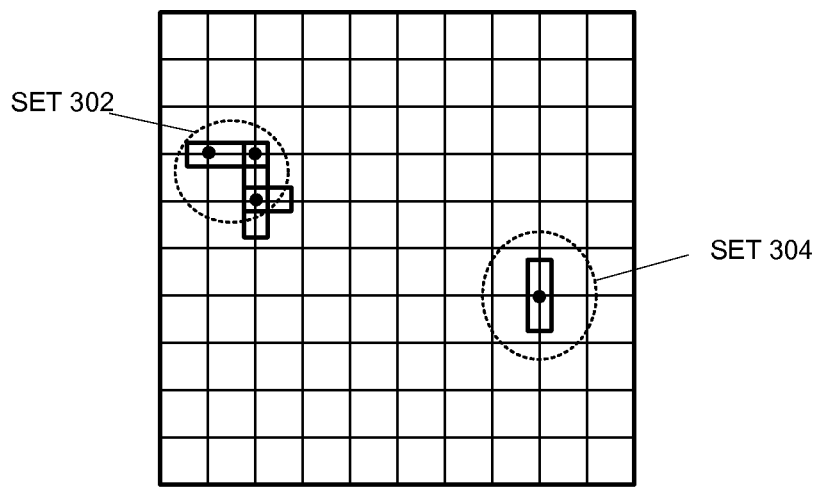
FIG. 3 illustrates an exemplary routing problem that a search engine attempts to solve.

FIG. 3 illustrates an exemplary routing problem that a search engine attempts to solve. As illustrated in FIG. 3, set 302 includes three points, and set 304 includes a single point. Note that a point can refer to existing components, or it can be a tapping point from the new routes to existing components. The search engine then attempts to find a path to connect any of the points in set 302 to the point in set 304.

One technique for finding paths in an IC chip design during a routing process involves constructing a three-dimensional (3D) regular grid structure (also referred to as a "3D maze") to represent the routing resources in the multiple metal layers. This 3D grid can be represented as a graph, and paths can be determined in the 3D grid by using graph theory techniques, e.g., techniques for determining the shortest path, etc.

In some embodiments, the 3D grid is formed using a set of 2-dimensional (2D) grids, wherein each 2D grid represents routing resources in a particular metal layer in the multiple metal layers. A 2D grid can comprise a set of parallel grid lines. Each layer usually has a preferred routing direction which is the direction in which the parallel grid lines are aligned.

Soft Routing Rules

A circuit design must satisfy certain foundry design rules before it can be taped-out. Specifically, a foundry may specify spacing rules that a design must meet, e.g., the foundry may specify the minimum distance between two shapes in the circuit design. If the circuit design does not meet the design rules, the circuit design may not be signed-off. These foundry design rules are referred to as "hard rules" in the discussion below.

After satisfying the foundry-defined minimum distance requirement, a larger distance between two shapes can usually improve the manufacturing yield. If we create hard spacing rules for design for manufacturing (DFM)-related criteria, we may never be able to sign-off circuit designs because the circuit may never be able to satisfy all the spacing rules.

Some embodiments of the present invention specify such a spacing requirement as a "soft spacing rule" instead of a hard spacing rule. Besides DFM-related criteria, other soft spacing rules can include user-defined rules. For example, a via may be placed in an IC design according to a hard rule of minimum spacing (e.g., at least 0.3 µm around the vias). At the same time, soft rules can be applied to reserve room around an existing via (e.g., at least 0.5 µm around the vias) so that a redundant via can be added later. Note that conventional routing techniques typically treat all rules (both hard and soft rules) with equal importance.

In conventional techniques, a hard spacing rule can be represented by creating "blocks" in the 3D grid so that the search engine gives a very high cost for wires that violate hard spacing rules. If we create "blocks" in the 3D grid for soft spacing rules, it would cause the routing engine to treat the soft spacing rules in the same manner as the hard spacing rules, which defeats the purpose of using soft spacing rules.

Some embodiments of the present invention use a novel and non-obvious approach for handling soft routing rules. Some embodiments of the present invention assign weights to both hard routing rules and soft routing rules to guide the search engine. The weights associated with the hard routing rules are typically substantially higher than those associated with the soft routing rules. Note that metal avoidance areas can be specified using hard or soft routing rules.

Note that the router will attempt to satisfy all routing rules. Unfortunately, this may not be possible in all cases. When the router is unable to satisfy all the routing rules, the router can use the weight associated with the rules to determine which rule to satisfy and which rule to violate. Specifically, when the routing resources are limited and the router has to choose between violating one of two rules, the router will violate the rule with the lower weight. In some embodiments, the router may decide to violate the minimum weighted subset of rules, i.e., the subset of rules with the minimum aggregate weight.

If soft routing rules are not processed properly, they can substantially increase the convergence time, because the router may keep iterating to satisfy the soft routing rules. Note that this fact may be counter-intuitive, because intuitively it seems that using soft routing rules can reduce convergence time. To overcome the convergence problem, some embodiments of the present invention associate an effort-level with each routing rule. Note that associating an effort-level with a routing rule is non-obvious. Specifically, since we have already associated a weight with each routing rule, it seems unnecessary to also associate an effort-level. However, this non-obvious insight can substantially improve routing convergence, as is described below.

If the effort-level for a routing rule is high, the router spends more time and resources trying to satisfy the rule. On the other hand, if the effort-level for a routing rule is low, the router spends less time and fewer resources trying to satisfy the rule. For example, the effort-level can be used for the router to determine the number of iterations, the routing convergence time, or the number of rip-up and re-routes that the router is allowed to perform for satisfying the routing rule. The system can define multiple effort-levels. For example, the system can define low, medium, and high effort-levels.

The effort-level allows the user to directly control the amount of time the router spends on satisfying the different routing rules and/or optimizing the optimization objectives. Note that generic optimization techniques typically create a single optimization function which represents the overall "quality" of the solution. However, in these conventional optimization techniques, the user typically does not have a mechanism by which the user can control how much time the optimization process spends on optimizing a particular optimization objective. In contrast to such generic optimization techniques, some embodiments of the present invention provide the user with fine-grained control over how much time the router spends on satisfying a particular optimization objective.

Note that, by associating both a weight and an effort-level with a routing rule, a router can make more sophisticated decisions on which routing rule has a higher priority, and which one has a lower priority. Table 1 presents an exemplary decision table which includes four combinations of the weight and the effort-level using two weight options and two effort-levels. Note that only three of the four combinations (shown as "Yes" in the table) are typically considered by a router in embodiments of the present invention. Specifically, a routing rule which is associated with a low weight and a high effort-level (shown as "No" in the table) may be undesirable, because the combination can cause a substantial increase in the convergence time. Note that if an embodiment uses more than two weights and effort-levels, the number of possible combinations between weights and effort-levels will be more than the four combinations shown in Table 1.

TABLE 1

|  | High Weight | Low Weight |
|---|---|---|
| High Effort | Yes | No |
| Low Effort | Yes | Yes |

Generating and Using Route Fix Guidance

Note that there is a tradeoff between the number of design rule violations that are expected to occur in the routing solution and the performance of the routing process. To improve performance, the router can be made to ignore certain design rules. For example, satisfying certain design rules may require execution of computationally intensive lithography models. Trying to satisfy such design rules during routing can substantially slow down the routing process. Hence, such design rules may not be considered during routing. As a result, the routing solution may include some design rule violations, which can be fixed during a post-routing flow.

In some approaches, the compliance checking tool that checks for design rule violations also fixes the violations. However, this approach has a serious drawback: it requires the compliance checking tool to know how to route wires. Hence, some approaches provide information to the router to enable the router to fix the design rule violation. For example, the compliance checking tool may specify that certain edges in the routed solution be moved by a certain amount. The information that a compliance checking tool provides to a router to enable the router to fix a design rule violation is called a route fix guidance.

Figure 4A:
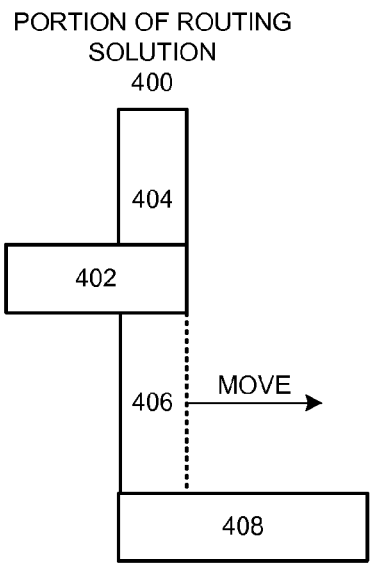
FIG. 4A illustrates a route fix guidance which specifies how an edge of a routing shape is to be moved.

FIG. 4A illustrates a route fix guidance which specifies how an edge of a routing shape is to be moved.

Portion of routing solution 400 includes routing shapes 402, 404, 406, and 408. In order to fix a design rule violation, a conventional compliance checking tool may specify that the right edge of routing shape 406 (shown as a dashed line) needs to be moved further right by a certain distance. Unfortunately, this type of route fix guidance is ambiguous because the right edge of routing shape 406 can be moved in multiple ways.

Figure 4B:
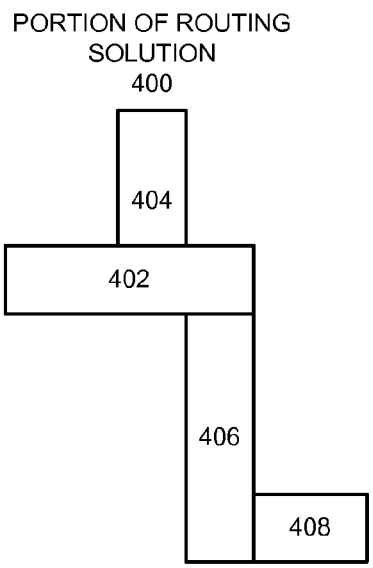
FIGS. 4B and 4C illustrate why the route fix guidance illustrated in FIG. 4A is ambiguous.
Figure 4C:
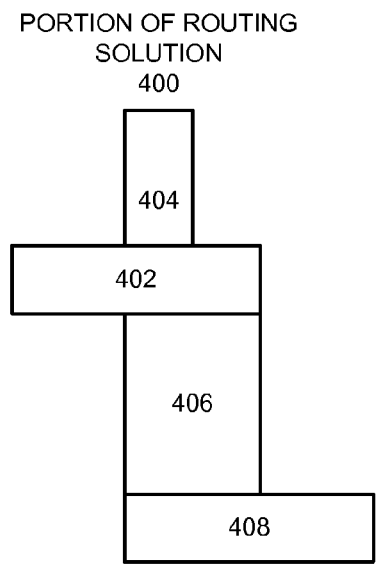

FIGS. 4B and 4C illustrate why the route fix guidance illustrated in FIG. 4A is ambiguous.

In FIG. 4B, the router moved the entire routing shape 406 to the right. Note that the router increased the length of routing shape 402, and decreased the length of routing shape 408, but did not increase the width of routing shape 406.

In FIG. 4C, on the other hand, the router increased the width of routing shape 406 and the length of routing shape 402, but did not change routing shape 408.

In other words, the same route fix guidance can result in different routing solutions depending on how the router interprets the route fix guidance. Due to this ambiguity, the compliance checking tool may need to be overly conservative in specifying the route fix guidance. Further, the benefit of specifying a route fix guidance decreases if it is uncertain whether the router will properly apply the route fix guidance.

Furthermore, in conventional techniques, the compliance checking tool typically provides a single route fix guidance to fix a design rule violation. If that does not work, the router reports a failure. Again, this can cause the compliance checking tool to be overly conservative in determining the route fix guidance for a design rule violation.

Note that, during compliance checking, the system typically identifies multiple design rule violations. In conventional techniques, there is no guarantee that fixing a particular design rule violation will not generate new design rule violations. In other words, conventional routers apply a set of route fix guidances independently of one another. If new design rule violations are created each time a violation is fixed, it can cause serious convergence problems.

Hence, what are needed are systems and techniques for generating and using route fix guidance without the above-described problems.

Figure 5:
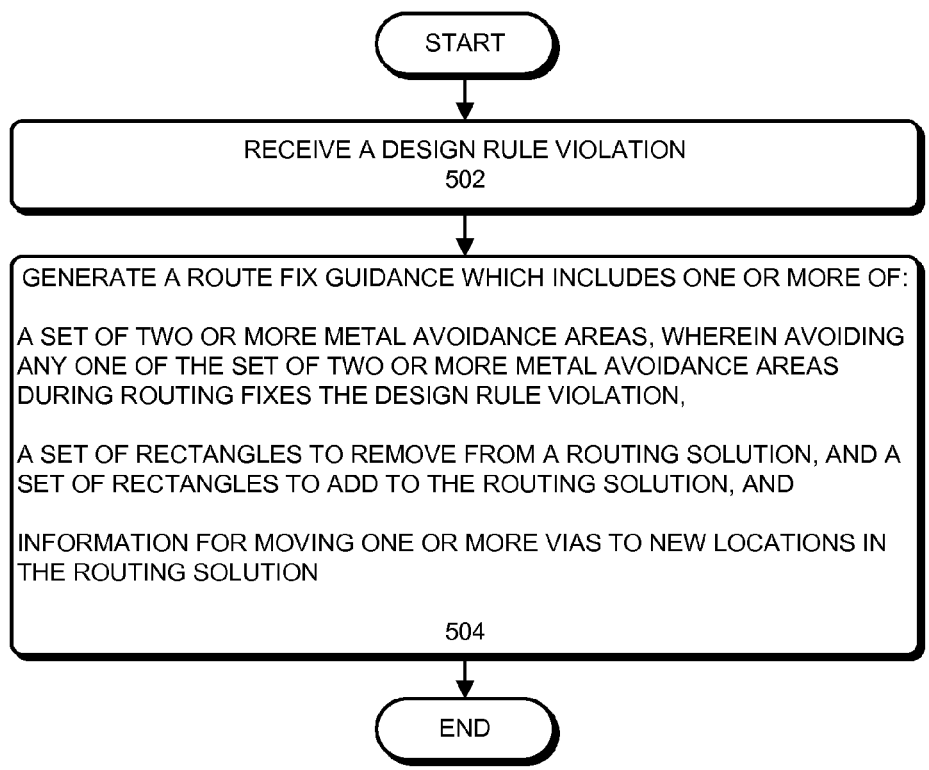
FIG. 5 presents a flowchart which illustrates a process for generating a route fix guidance in accordance with some embodiments of the present invention.

FIG. 5 presents a flowchart which illustrates a process for generating a route fix guidance in accordance with an embodiment of the present invention.

The process can begin by receiving a design rule violation (step 502). Next, the system can generate a route fix guidance which includes one or more of: a set of two or more metal avoidance areas, wherein avoiding any one of the set of two or more metal avoidance areas during routing fixes the design rule violation; a set of rectangles to remove from a routing solution, and a set of rectangles to add to the routing solution; and information for moving one or more vias to new locations in the routing solution (step 504). The route fix guidance can also specify a sequence in which the set of two or more metal avoidance areas are to be used for fixing the design rule violation. The system can create one or more soft or hard routing rules based on a metal avoidance area such that satisfying the soft or hard routing rules causes the routing solution to avoid the metal avoidance area.

Note that each metal avoidance area can be specified using a set of one or more rectangles. Further, note that the set of rectangles to remove from a routing solution, and the set of rectangles to add to a routing solution correspond to portions of wires in metal layers which electrically connect devices in the integrated circuit.

Figure 6:
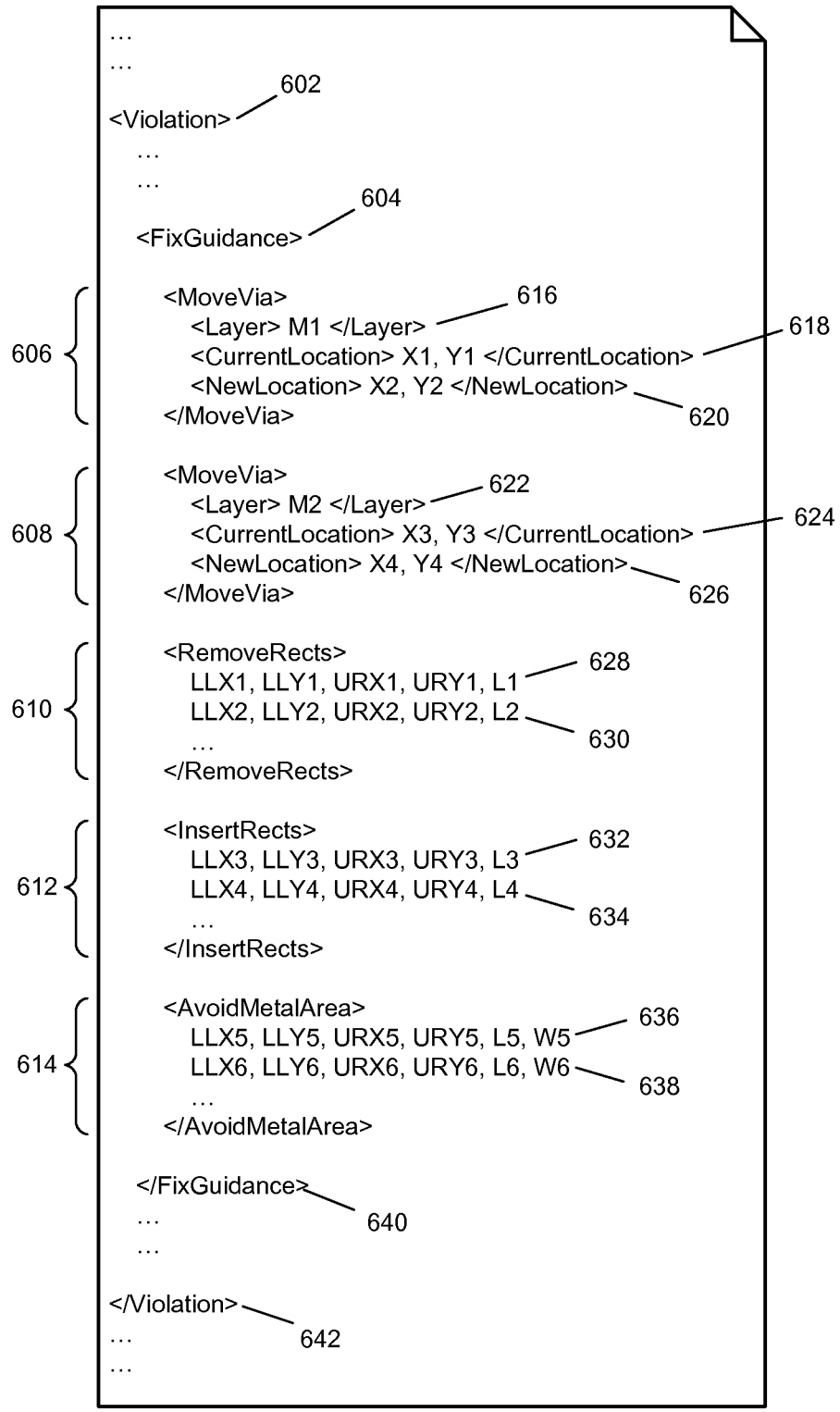
FIG. 6 illustrates exemplary route fix guidance information in accordance with some embodiments of the present invention.

FIG. 6 illustrates exemplary route fix guidance information in accordance with an embodiment of the present invention.

Route fix guidance information 600 can generally be in any data format. In some embodiments, the route fix guidance information is formatted in a human-readable format. For example, route fix guidance information can be formatted in XML (eXtensible Markup Language).

Route fix guidance information 600 can include route fix guidance for multiple design rule violations. Tags 602 and 642 can be used to enclose the route fix guidance information for fixing a particular design rule violation. Note that a design rule violation can have multiple route fix guidances.

Tags 604 and 640 can be used to enclose a route fix guidance. A route fix guidance can include information for moving vias, e.g., information blocks 606 and 608. Further, a route fix guidance can include information for removing rectangles, e.g., information block 610, and for inserting rectangles, e.g., information block 612. A route fix guidance can also include information for avoiding metal areas, e.g., information block 614.

The router can use information block 606 to move a via. Note that the location for the vias can be specified by specifying the mask layer, and the X and Y coordinates in the mask layer. Specifically, line 616 indicates that the via is in mask layer M1; line 618 indicates that the via is currently located at (X1, Y1); and line 620 indicates that the via is to be moved to (X2, Y2). Information block 608 can be used to move another via. Specifically, line 622 indicates that the via is in mask layer M2; line 624 indicates that the via is currently located at (X3,Y3); and line 626 indicates that the via needs to be moved to location (X4,Y4).

Note that a via is a complex routing object. A via is typically based on a via master which defines the numerous parameters for the via, e.g., the dimensions of the metal surround areas, etc. The via master information is usually internal to the router, and therefore, is not known to a compliance checking tool. Hence, a route fix guidance usually cannot instruct the router to create a new via because that would require the compliance checking tool to either provide the numerous parameters of the via or specify a via master. However, since information blocks 606 and 608 instruct the router to move existing vias, they do not need to specify any of the parameters for the via, nor do they need to specify a via master. The router can look up the via master for the existing via, and use that via master to create the new via at the new location.

Information block 610 specifies a set of rectangles that need to be removed. Specifically, line 628 specifies a rectangle in mask layer L1 whose lower left corner is located at (LLX1, LLY1), and whose upper right corner is located at (URX1, URY1). Line 630 specifies another rectangle, which is in mask layer L2, and whose lower left corner is located at (LLX2, LLY2), and whose upper right corner is located at (URX2, URY2).

Information block 612 specifies a set of rectangles that need to be inserted. Specifically, line 632 specifies a rectangle in mask layer L3 whose lower left corner is located at (LLX3, LLY3), and whose upper right corner is located at (URX3, URY3). Line 634 specifies another rectangle, which is in mask layer L4, and whose lower left corner is located at (LLX4, LLY4), and whose upper right corner is located at (URX4, URY4).

Information block 614 can specify a set of one or more metal avoidance areas in the layout such that avoiding any one of metal avoidance areas during re-routing is expected to fix the design rule violation. Specifically, line 636 specifies a metal avoidance area in layer L5 whose lower left corner is located at (LLX5, LLY5) and whose upper right corner is located at (URX5, URY5). Further, line 636 specifies that a weight of W5 should be assigned to this metal avoidance area during re-routing. Similarly, line 638 specifies a metal avoidance area in layer L6 whose lower left corner is located at (LLX6, LLY6) and whose upper right corner is located at (URX6, URY6), and that a weight of W6 should be assigned to this metal avoidance area during re-routing.

In FIG. 6, a metal avoidance area is specified as a single rectangle. It will be apparent that the metal avoidance area format shown in FIG. 6 can be easily extended to include multiple rectangles. In general, a metal avoidance area can include one or more non-overlapping, arbitrarily shaped areas.

The route fix guidance format shown in FIG. 6 is not intended to be exhaustive or to limit the scope of the present invention. Accordingly, many modifications and variations will be apparent to practitioners having ordinary skill in the art. Specifically, in addition to the information shown in FIG. 6, a route fix guidance may include a version number of the format, a date stamp, a length unit (e.g., nm), a category and/or type for the violation, a severity of the violation, etc.

From the router's viewpoint, the operations specified in a route fix guidance can be divided into two categories. The first category includes specific modifications that need to be performed on the routing solution. For example, this category can include operations such as removing rectangles, inserting rectangles, and moving vias. Note that these operations clearly indicate how the routing solution is to be modified.

The second category includes constraints for re-routing a portion of the routing solution. For example, a set of metal avoidance areas falls into this category because each metal avoidance area in the set of metal avoidance areas is a constraint that the router needs to satisfy during the re-routing process. In some embodiments, the router first applies the specific modifications, and then performs the re-routing process using the constraints. Note that all of the operations (e.g., remove rectangles, insert rectangles, move vias, etc.) specified in a route fix guidance typically need to be applied together.

A router may perform one or more sanity checks on the route fix guidance before applying it. For example, if a route fix guidance specifies that a particular rectangle is to be removed, and if the rectangle intersects with a metal surround of a via, the router can reject the route fix guidance. Note that, since all of the modifications in the route fix guidance are to be applied together, the router may reject the entire route fix guidance even if only one of the modifications fails the router's sanity checks.

Note that there are a number of advantages of using a route fix guidance format like the one illustrated in FIG. 6. First, the format enables a compliance checking tool to unambiguously specify the rectangles that need to be removed or inserted, and the vias that need to be moved.

Second, the format can be used to provide multiple route fix guidance options to the router. Specifically, a route fix guidance can include multiple metal avoidance areas, each with its own weight. The router can use the first metal avoidance area to fix the design rule violation. If the attempt fails, the router can try the next metal avoidance area, and so forth. Note that this is a major improvement over conventional techniques which typically provide only one option. In conventional techniques, if the route fix guidance does not fix the design rule violation, the design rule violation is usually reported as unfixable. However, in some embodiments of the present invention, the route fix guidance format allows a compliance checking tool to provide multiple "fall back" options so that if the best route fix guidance option does not fix the design rule violation, the router can try to fix the design rule violation using the fall back options. This can substantially reduce the convergence time required for resolving all of the design rule violations in a routing solution.

Third, the information blocks that are used for specifying the route fix guidance are generic (i.e., they are not designed for fixing a specific type of design rule violation), so that a wide range of compliance checking tools can use the format to specify route fix guidance to a router.

Figure 7:
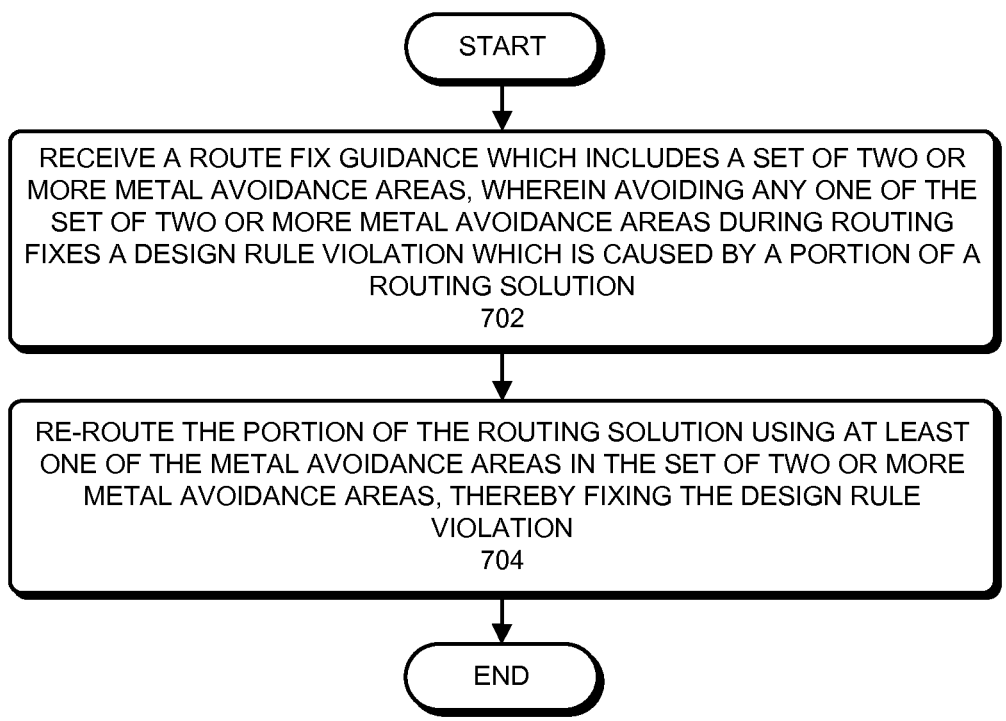
FIG. 7 presents a flowchart which illustrates a process for using a route fix guidance in accordance with some embodiments of the present invention.

FIG. 7 presents a flowchart which illustrates a process for using a route fix guidance in accordance with an embodiment of the present invention.

The process can begin by receiving a route fix guidance which includes a set of two or more metal avoidance areas, wherein avoiding any one of the set of two or more metal avoidance areas during routing fixes a design rule violation which is caused by a portion of a routing solution (step 702).

Next, the system can re-route the portion of the routing solution using at least one of the metal avoidance areas in the set of two or more metal avoidance areas, thereby fixing the design rule violation (step 704).

Figure 8:
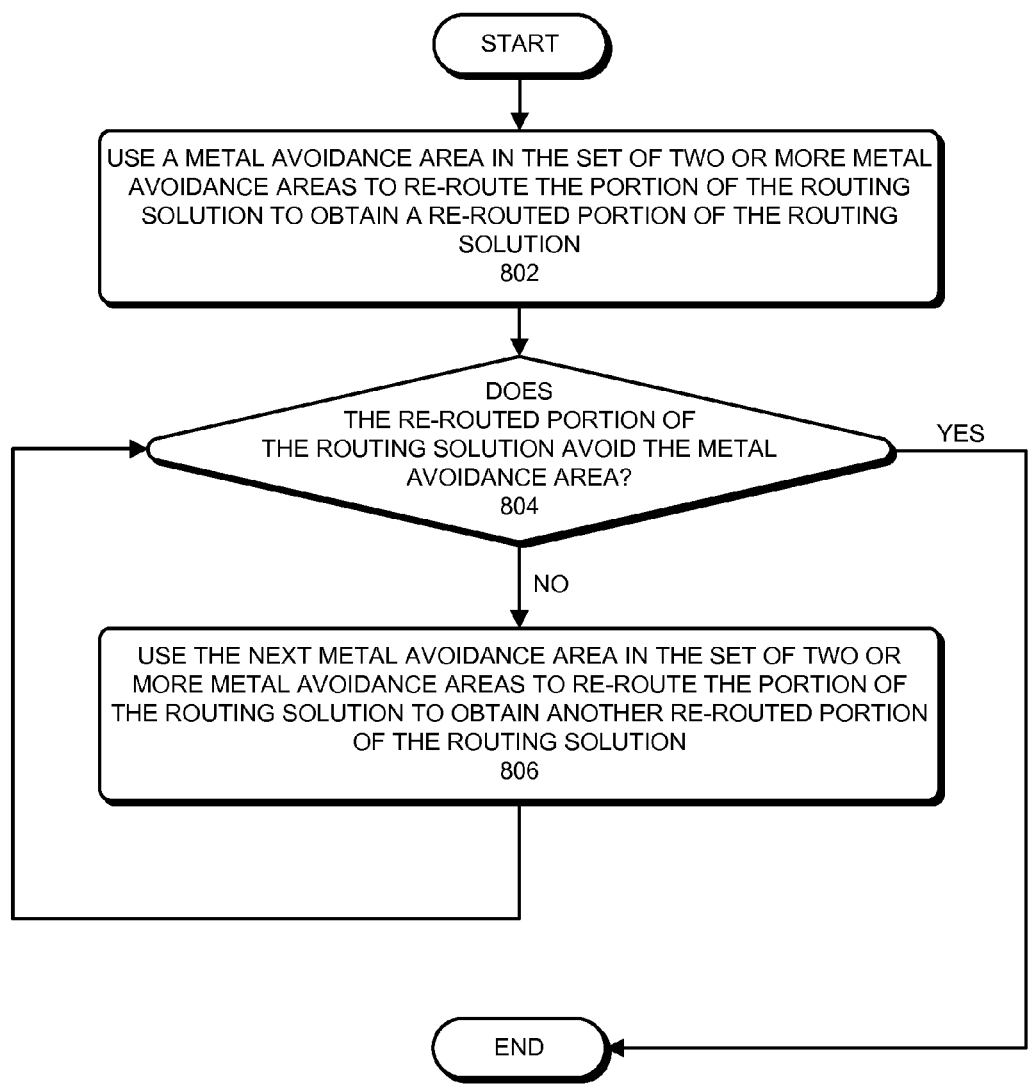
FIG. 8 presents a flowchart which illustrates a process for using a set of two or more metal avoidance areas to fix a design rule violation in accordance with some embodiments of the present invention.

FIG. 8 presents a flowchart which illustrates a process for using a set of two or more metal avoidance areas to fix a design rule violation in accordance with an embodiment of the present invention.

The process illustrated in FIG. 8 can be performed during step 704 in FIG. 7. Specifically, the system can iterate over the two or more metal avoidance areas to determine a re-route solution that avoids at least one of the metal avoidance areas.

As shown in FIG. 8, the process can begin by using a metal avoidance area in the set of two or more metal avoidance areas to re-route the portion of the routing solution to obtain a re-routed portion of the routing solution (step 802). Specifically, the system can identify wire portions that intersect with the metal avoidance area. Next, the system can rip up the identified wire portions, and attempt to re-route the wire portions around the metal avoidance area.

Figure 9A:
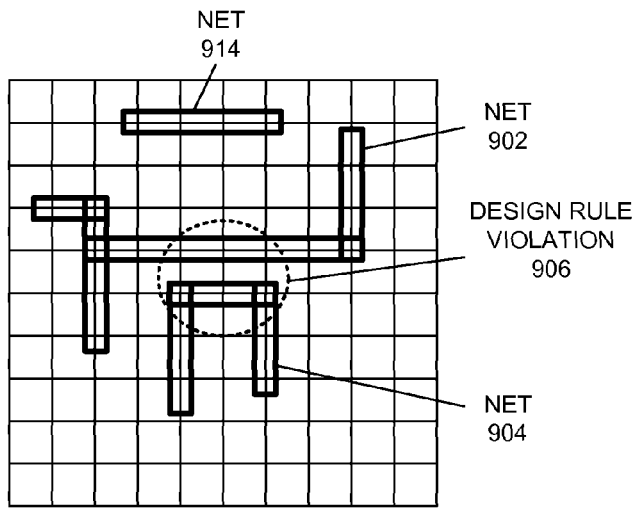
FIGS. 9A-9C illustrate how a metal avoidance area can be used to re-route a portion of a routing solution in accordance with some embodiments of the present invention.
Figure 9B:
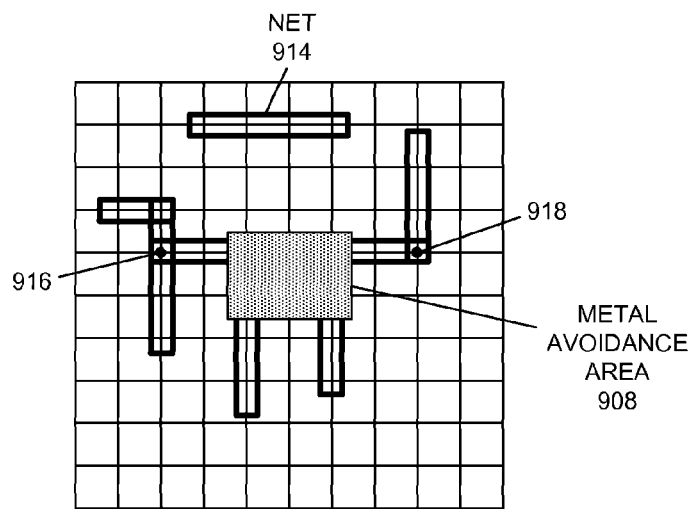
Figure 9C:
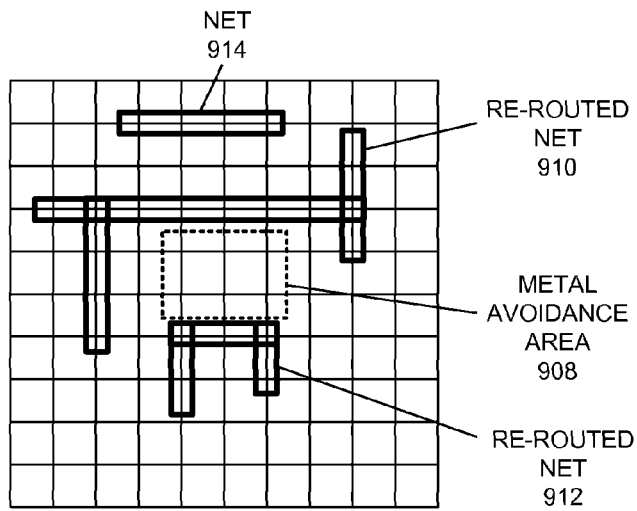

FIGS. 9A-9C illustrate how a metal avoidance area can be used to re-route a portion of a routing solution in accordance with an embodiment of the present invention.

FIG. 9A illustrates a design rule violation 906 which is caused by portions of nets 902 and 904. FIG. 9B illustrates how metal avoidance area 908 can be specified to guide the router to fix design rule violation 906. The router can rip up portions of nets 902 and 904 which intersect with metal avoidance area 908, and determine alternative routes to electrically connect the nets. Note that the router can rip up more than the portion that intersects with the metal avoidance area. For example, the router can rip up the wire segment between points 916 and 918. FIG. 9C illustrates the routing solution after the re-routing process. Specifically, net 902 has been re-routed to obtain re-routed net 910, and net 904 has been re-routed to obtain net 912.

Returning to the discussion of FIG. 8, the system can then determine whether the re-routed portion of the routing solution avoids the metal avoidance area (step 804).

If the re-routed portion avoids the metal avoidance area, then that means that the design rule violation has been fixed, and the process can end ("YES" branch of step 804). For example, re-routed nets 910 and 912 do not intersect the metal avoidance area 908. Hence, the system can move on to fixing other design rule violations.

On the other hand, if the re-routed portion does not avoid the metal avoidance area ("NO" branch of step 804), the system can use the next metal avoidance area in the set of two or more metal avoidance areas to re-route the portion of the routing solution to obtain another re-routed portion of the routing solution (step 806). Next, the system can determine whether the current re-routed portion avoids the current metal avoidance area, and if not, try the next metal avoidance area, and so forth. For example, if either re-routed net 910 or re-routed net 912 had intersected with metal avoidance area 908, the system would have discarded the re-routed solution and used the next metal avoidance area in the set of metal avoidance areas.

If none of the metal avoidance areas fixes the violation, the system can report an error to the user indicating that the system was unable to fix the design rule violation.

Note that applying a route fix guidance to a routing solution can create new design rule violations. For example, the space between net 914 and re-routed net 910 is less than the space between net 914 and net 902. This decrease in space may create a new design rule violation. This is a drawback with conventional techniques which typically fix design rule violations independently of one another. In contrast with conventional techniques, some embodiments of the present invention reduce the probability of creating new design rule violations while applying a route fix guidance.

Figure 10:
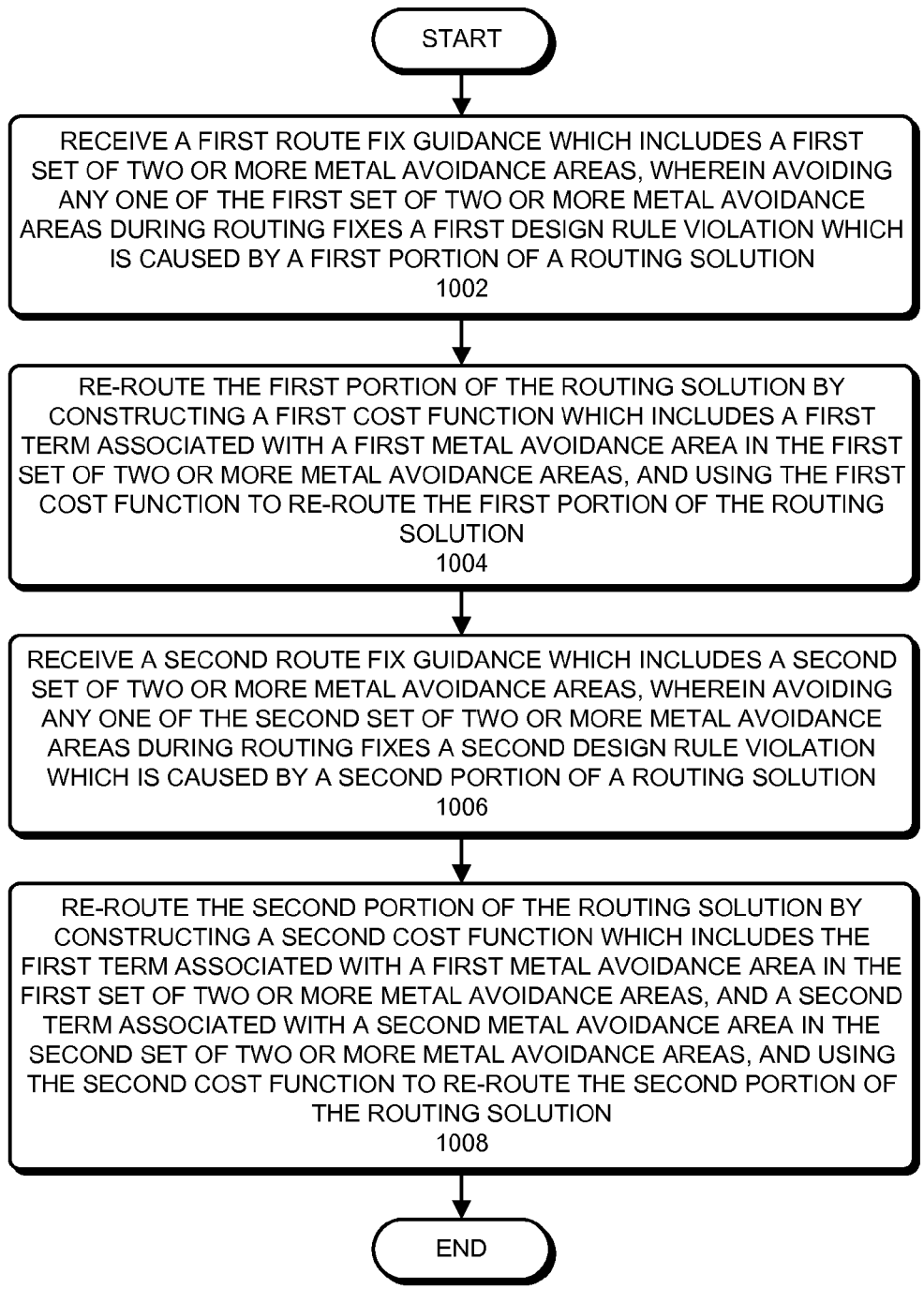
FIG. 10 presents a flowchart that illustrates a process for applying multiple route fix guidances to a routing solution in accordance with some embodiments of the present invention.

FIG. 10 presents a flowchart that illustrates a process for applying multiple route fix guidances to a routing solution in accordance with an embodiment of the present invention.

The process can begin by receiving a first route fix guidance which includes a first set of two or more metal avoidance areas, wherein avoiding any one of the first set of two or more metal avoidance areas during routing fixes a first design rule violation which is caused by a first portion of a routing solution (step 1002).

Next, the system can re-route the first portion of the routing solution by constructing a first cost function which includes a first term associated with a first metal avoidance area in the first set of two or more metal avoidance areas, and using the first cost function to re-route the first portion of the routing solution (step 1004).

For example, the value of the first term can be proportional to the total wire length that intersects with the first metal avoidance area. Alternatively, the first term can have discrete values depending on whether the re-routed first portion intersects with the first metal avoidance area or not. For example, if the re-routed first portion does not intersect, the value of the first term can be zero; but, if the re-routed first portion intersects, then the value of the first term can be equal to a predetermined constant regardless of the extent to which the re-routed first portion intersects with the first metal avoidance area.

The system can then receive a second route fix guidance which includes a second set of two or more metal avoidance areas, wherein avoiding any one of the second set of two or more metal avoidance areas during routing fixes a second design rule violation which is caused by a second portion of a routing solution (step 1006).

Next, the system can re-route the second portion of the routing solution by constructing a second cost function which includes the first term associated with a first metal avoidance area in the first set of two or more metal avoidance areas, and a second term associated with a second metal avoidance area in the second set of two or more metal avoidance areas, and using the second cost function to re-route the second portion of the routing solution (step 1008). Note that, in the second cost function, the weight of the second term is greater than the weight of the first term because the primary goal of the second cost function is to determine a route that avoids the second metal avoidance area.

For example, the value of the second term can be proportional to the total wire length that intersects with the second metal avoidance area. Alternatively, the value of the second term can have discrete values depending on whether the re-routed second portion intersects with the second metal avoidance area or not.

Figure 11:
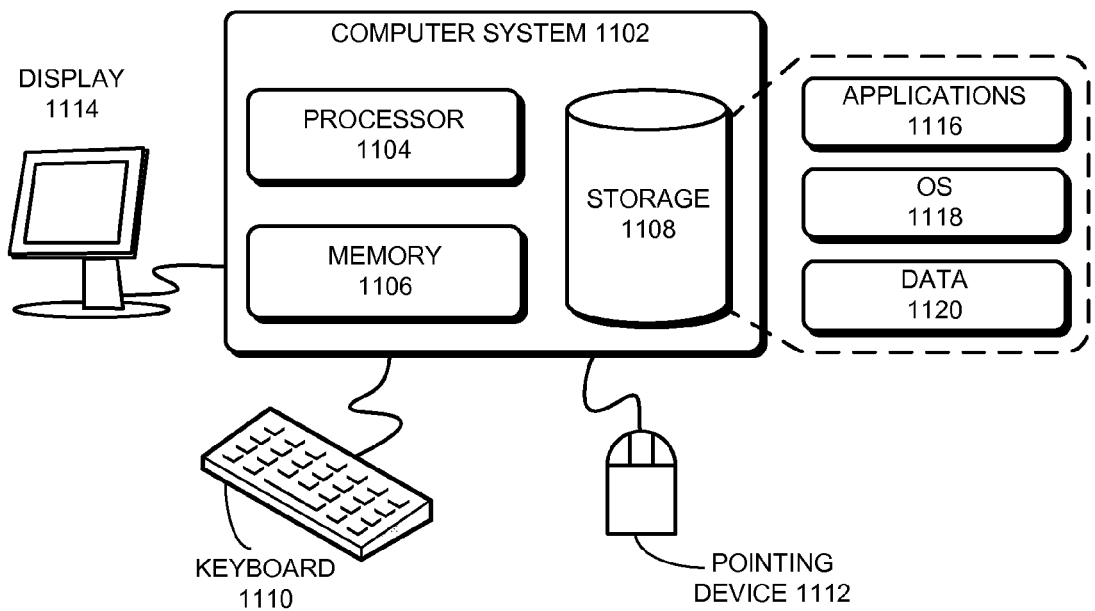
FIG. 11 illustrates a computer system in accordance with some embodiments of the present invention.

FIG. 11 illustrates a computer system in accordance with some embodiments of the present invention.

A computer or computer system can generally be any hardware system that can perform computations. Specifically, a computer can be a microprocessor-based system, wherein the microprocessor can include one or more processing cores. A computer can also be a network-processor-based system, a digital-signal-processor-based system, a portable computing device, a personal organizer, a distributed-computing-platform-based system, or any other computing system now known or later developed.

Computer system 1102 comprises processor 1104, memory 1106, and storage 1108. Computer system 1102 can be coupled with display 1114, keyboard 1110, and pointing device 1112. Storage 1108 can generally be any device that can store data. Specifically, a storage device can be a magnetic, an optical, or a magneto-optical storage device, or it can be based on flash memory and/or battery-backed up memory. Storage 1108 can store applications 1116, operating system 1118, and data 1120.

Applications 1116 can include instructions that when executed by computer 1102 cause computer 1102 to perform one or more processes described in this disclosure. Data 1120 can include routed netlists, design rules, route fix guidances, and/or any other data that is inputted or outputted by one or more processes described in this disclosure.

Figure 12:
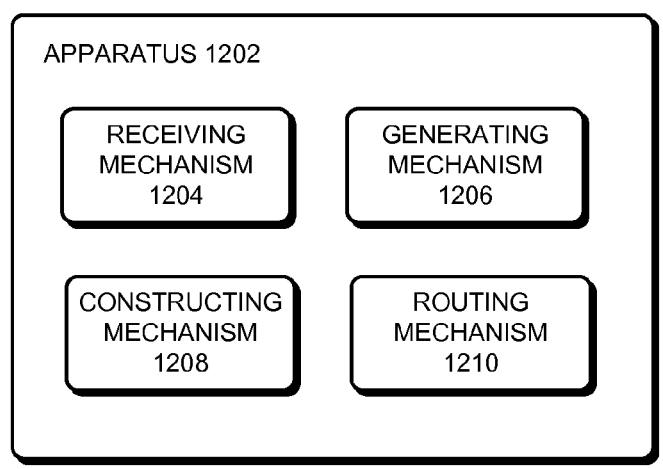
FIG. 12 illustrates an apparatus in accordance with some embodiments of the present invention.

FIG. 12 illustrates an apparatus in accordance with some embodiments of the present invention.

Apparatus 1202 can comprise a number of mechanisms which may communicate with one another via a wired or wireless communication channel. Apparatus 1202 may be realized using one or more integrated circuits. Apparatus 1202 may be integrated with a computer system, or it may be realized as a separate device which is capable of communicating with other computer systems and/or devices.

Specifically, apparatus 1202 can comprise one or more of the following mechanisms: receiving mechanism 1204, generating mechanism 1206, constructing mechanism 1208, and routing mechanism 1210.

In some embodiments, receiving mechanism 1204 can be configured to receive a design rule violation, and generating mechanism 1206 can be configured to generate a route fix guidance which includes a set of two or more metal avoidance areas, wherein avoiding any one of the set of two or more metal avoidance areas during routing fixes the design rule violation.

In some embodiments, receiving mechanism 1204 can be configured to receive a route fix guidance which includes a set of two or more metal avoidance areas, wherein avoiding any one of the set of two or more metal avoidance areas during routing fixes a design rule violation which is caused by a portion of a routing solution. Constructing mechanism 1208 can be configured to construct a cost function which includes a term associated with a metal avoidance area. Routing mechanism 1210 can be configured to use the cost function to re-route the portion of the routing solution, thereby fixing the design rule violation.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners having ordinary skill in the art. Additionally, the above disclosure is not intended to limit the present invention. The scope of the present invention is defined by the appended claims.

What is claimed is:

1. A method for fixing a design rule violation using a route fix guidance, the method comprising:
receiving a first route fix guidance to fix a first design rule violation in a first portion of a routing solution, wherein the first route fix guidance includes a first set of two or more metal avoidance areas;
using a first metal avoidance area in the first set of two or more metal avoidance areas to re-route the first portion of the routing solution to obtain a first re-routed portion of the routing solution; and
in response to determining that the first re-routed portion of the routing solution does not avoid the first metal avoidance area, using a second metal avoidance area in the first set of two or more metal avoidance areas to re-route the first portion of the routing solution to obtain a second re-routed portion of the routing solution.

2. The method of claim 1, wherein each metal avoidance area is specified as a set of one or more rectangles.

3. The method of claim 1, wherein re-routing the first portion of the routing solution includes:
constructing a first cost function which includes a first term associated with a first metal avoidance area in the first set of two or more metal avoidance areas; and
using the first cost function to re-route the first portion of the routing solution.

4. The method of claim 3, wherein the method further includes:
receiving a second route fix guidance which includes a second set of two or more metal avoidance areas, wherein avoiding any one of the second set of two or more metal avoidance areas during routing fixes a second design rule violation which is caused by a second portion of a routing solution;
constructing a second cost function which includes:
the first term associated with the first metal avoidance area in the first set of two or more metal avoidance areas; and
a second term associated with a second metal avoidance area in the second set of two or more metal avoidance areas; and
using the second cost function to re-route the second portion of the routing solution.

5. The method of claim 4, wherein the second term's weight in the cost function is greater than the first term's weight.

6. A non-transitory computer-readable storage medium storing instructions that when executed by a computer cause the computer to perform a method for fixing a design rule violation using a route fix guidance, the method comprising:

receiving a first route fix guidance to fix a first design rule violation in a first portion of a routing solution, wherein the first route fix guidance includes a first set of two or more metal avoidance areas;

using a first metal avoidance area in the first set of two or more metal avoidance areas to re-route the first portion of the routing solution to obtain a first re-routed portion of the routing solution; and in response to determining that the first re-routed portion of the routing solution does not avoid the first metal avoidance area, using a second metal avoidance area in the first set of two or more metal avoidance areas to re-route the first portion of the routing solution to obtain a second re-routed portion of the routing solution.

7. The non-transitory computer-readable storage medium of claim 6, wherein each metal avoidance area is specified as a set of one or more rectangles.

8. The non-transitory computer-readable storage medium of claim 6, wherein re-routing the first portion of the routing solution includes:

constructing a first cost function which includes a first term associated with a first metal avoidance area in the first set of two or more metal avoidance areas; and using the first cost function to re-route the first portion of the routing solution.

9. The non-transitory computer-readable storage medium of claim 8, wherein the method further includes:

receiving a second route fix guidance which includes a second set of two or more metal avoidance areas, wherein avoiding any one of the second set of two or more metal avoidance areas during routing fixes a second design rule violation which is caused by a second portion of a routing solution;

constructing a second cost function which includes:
the first term associated with the first metal avoidance area in the first set of two or more metal avoidance areas; and
a second term associated with a second metal avoidance area in the second set of two or more metal avoidance areas; and using the second cost function to re-route the second portion of the routing solution.

10. The non-transitory computer-readable storage medium of claim 9, wherein the second term's weight in the cost function is greater than the first term's weight.

11. An apparatus for fixing a design rule violation using a route fix guidance, the apparatus comprising:

a receiving mechanism configured to receive a first route fix guidance to fix a first design rule violation in a first portion of a routing solution, wherein the first route fix guidance includes a first set of two or more metal avoidance areas; and a routing mechanism configured to:
use a first metal avoidance area in the first set of two or more metal avoidance areas to re-route the first portion of the routing solution to obtain a first re-routed portion of the routing solution; and in response to determining that the first re-routed portion of the routing solution does not avoid the first metal avoidance area, use a second metal avoidance area in the first set of two or more metal avoidance areas to re-route the first portion of the routing solution to obtain a second re-routed portion of the routing solution.

12. The apparatus of claim 11, wherein each metal avoidance area is specified as a set of one or more rectangles.

13. The apparatus of claim 11, wherein the routing mechanism is further configured to:

construct a first cost function which includes a first term associated with a first metal avoidance area in the first set of two or more metal avoidance areas; and use the first cost function to re-route the first portion of the routing solution.

14. The apparatus of claim 13, wherein the routing mechanism is further configured to:

receive a second route fix guidance which includes a second set of two or more metal avoidance areas, wherein avoiding any one of the second set of two or more metal avoidance areas during routing fixes a second design rule violation which is caused by a second portion of a routing solution;

construct a second cost function which includes:
the first term associated with the first metal avoidance area in the first set of two or more metal avoidance areas; and
a second term associated with a second metal avoidance area in the second set of two or more metal avoidance areas; and use the second cost function to re-route the second portion of the routing solution.

15. The apparatus of claim 14, wherein the second term's weight in the cost function is greater than the first term's weight.

16. A method for fixing a design rule violation in a portion of a routing solution, the method comprising:

receiving a route fix guidance to fix the design rule violation in the portion of the routing solution, wherein the route fix guidance specifies two or more metal avoidance areas; and re-routing the portion of the routing solution, wherein at least one, but not all, of the two or more metal avoidance areas are avoided.

17. The method of claim 16, wherein each metal avoidance area is specified as a set of one or more rectangles.

18. The method of claim 16, wherein re-routing the portion of the routing solution includes:

constructing a cost function which includes a term associated with a metal avoidance area in the two or more metal avoidance areas; and using the cost function to re-route the portion of the routing solution.

* * * * *